219-121  SR
12/31/85    XR    4,561,382

United States Patent [19]
Zeren

[11] Patent Number: 4,561,382
[45] Date of Patent: Dec. 31, 1985

[54] VACUUM VAPOR DEPOSITION GUN ASSEMBLY

[75] Inventor: Joseph D. Zeren, Boulder, Colo.

[73] Assignee: The United States of America as represented by the United States Department of Energy, Washington, D.C.

[21] Appl. No.: 554,414

[22] Filed: Nov. 22, 1983

[51] Int. Cl.$^4$ .............................................. C23C 14/30
[52] U.S. Cl. .................................. 118/727; 118/726; 204/298; 219/121 EE; 219/121 EF
[58] Field of Search ............................ 204/192 R, 298; 118/726, 727, 715, 723; 219/121 EE, 121 EF, 121 EG, 275

[56] References Cited

U.S. PATENT DOCUMENTS 3,267,015  8/1966  Morley .............................. 204/192 R
3,562,141  2/1971  Morley ................................ 204/298

OTHER PUBLICATIONS

J. Luce, "Intense Gaseous Discharges", *Proceedings of Second U.N. Conference on Peaceful Uses of Atomic Energy,* (1958) 31, pp. 305-314.
L. M. Lidsky et al., "Highly Ionized Hollow Cathode Discharge", *Journal of Applied Physics,* vol. 33, No. 8, Aug. 1962, pp. 2490-2497.
J. R. Morley, "The Hollow Cathode Discharge", *Proceedings of the Fifth Annual Meeting of the Electron Beam Symposium,* Mar. 28, 1963, p. 368-377.
C. T. Wan et al., "Investigation of Hot-Filament and Hollow-Cathode Electron-Beam Techniques for Ion Plating", *Journal of Vac. Sci. and Technol.,* vol. 8, No. 6, Nov./Dec. 1971, pp. 99-104.
D. G. Williams, "Vacuum Coating with a Hollow Cathode Source", *Journal of Vac. Sci. and Technol.,* vol. 11, No. 1, Jan./Feb. 1974, pp. 374-376.
G. Mah, "PVD by Electron Beam Processes", *Plating and Surface Finishing,* 1983.

*Primary Examiner*—Andrew H. Metz
*Assistant Examiner*—William T. Leader
*Attorney, Agent, or Firm*—George H. Libman; Albert Sopp; Judson R. Hightower

[57] ABSTRACT

A vapor deposition gun assembly includes a hollow body having a cylindrical outer surface and an end plate for holding an adjustable heat sink, a hot hollow cathode gun, two magnets for steering the plasma from the gun into a crucible on the heat sink, and a shutter for selectively covering and uncovering the crucible.

9 Claims, 5 Drawing Figures

VACUUM VAPOR DEPOSITION GUN ASSEMBLY

BACKGROUND OF THE INVENTION

The present invention relates generally to a vacuum vapor deposition gun assembly, and more particularly to a hot hollow cathode gun assembly with improved flexibility. The United States Government has rights in this invention pursuant to Contract No. DE-AC04-76DP03533 between the Department of Energy and Rockwell International.

Physical vapor deposition by electron beam evaporation is well known as a method of manufacturing corrosion and oxidation resistant coatings, magnetic coatings, optical coatings, structural and electrically resistive elements, and coatings for subsequent diffusion bonding. Most commercially available electron beam evaporation sources apply several thousand volts at approximately one ampere to a filament cathode to develop the electron beam. However, another source for electron beam evaporation is the hot hollow cathode, which source generates electrons from an applied voltage of approximately 25 volts and a current on the order of 250 amperes.

The differences inherent in these electron sources causes the electrons produced by each of them to have different current-density and kinetic energy. Only the electrons from the hot hollow cathode have the desirable density and kinetic energy to ionize the evaporant atoms. These ions may then be used to sputter-clean the substrate prior to deposition, resulting in an excellent adhesion between the coating and substrate. In addition, the hot hollow cathode has the advantage of high adhesion at a lower substrate temperature than does the filament cathode, eliminating substrate distortion.

Although the hot hollow cathode has been known since 1973, until this invention this source has not been practical for R&D facilities. Electron beam deposition occurs in a vacuum chamber containing a source, a crucible of material to be deposited, and a substrate upon which the material will be deposited. Prior hot hollow cathode installations did not provide for relative movement of gun and crucible; the crucible to substrate distance could only be changed by moving the substrate holding fixture. The radial distance between the crucible and the substrate center line could not be changed, a factor severely limiting the flexibility of a given installation where many different substrates are to be coated.

SUMMARY OF THE INVENTION

It is an object of this invention to provide a vapor deposition gun assembly which may be moved within a vacuum chamber.

It is another object of this invention to provide a vapor deposition gun assembly wherein the crucible may be moved relative to the substrate.

Additional objects, advantages and novel features of the invention will become apparent to those skilled in the art upon examination of the following description or may be learned by practice of the invention. The objects and advantages of the invention may be realized and attained by means of the instrumentalities and combinations particularly pointed out in the appended claias.

To achieve the foregoing and other objects, and in accordance with the purpose of the present invention, as embodied and broadly described herein, the vapor deposition gun assembly of this invention may comprise a cylindrical, hollow body, a cylindrical heat sink mounted within an end of the body, a gun for providing a source of electrons for evaporating the deposition material having a first cylindrical outer surface and a tip at one end of the surface, the gun being mounted adjacent to the heat sink, a crucible contacting the heat sink adjacent the tip, a plurality of magnets fastened to the body for directing the gun output into the crucible, and a shutter for selectively covering or uncovering the crucible, thereby permitting control over release of deposition material. In a preferred embodiment, the gun is a hot hollow cathode.

BRIEF DESCRIPTION OF THE DRAWINGS

The accompanying drawings, which are incorporated in and form a part of the specification, illustrate an embodiment of the present invention, and, together with the description, serve to explain the principles of the invention.

DETAILED DESCRIPTION OF THE INVENTION

Figure 1:
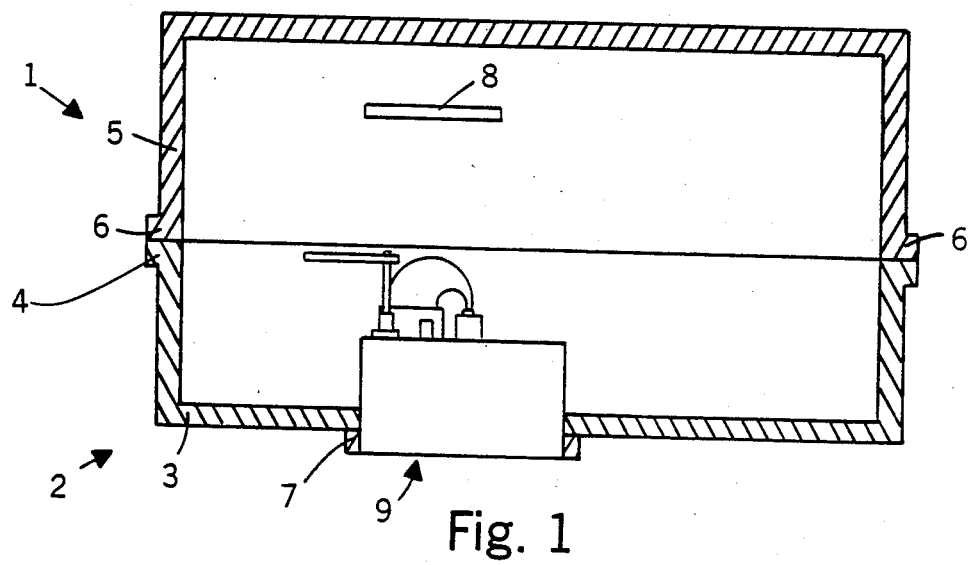
FIG. 1 is a partial cutaway view of the invention incorporated in a vacuum chamber.

FIG. 1 shows a vacuum deposition system including a typical vacuum chamber 2 comprised of a bottom portion 3 having a bottom flange 4, and an upper bell 5 having a bell flange 6. The flanges are sealed together by evacuation to form a vacuum tight chamber 2, which may be evacuated by suitable pump means (not shown). Located within chamber 2 for coating as hereinafter described, is a substrate 8, which may be supported by any known means (not shown) as required by the application. In addition, vapor deposition gun assembly 9 is adjustably mounted through bottom 3 by release clamp 7 in accordance with this invention. O-ring seals (not shown) between gun assembly 9 and bottom 3 are also provided (not shown).

Figure 2:
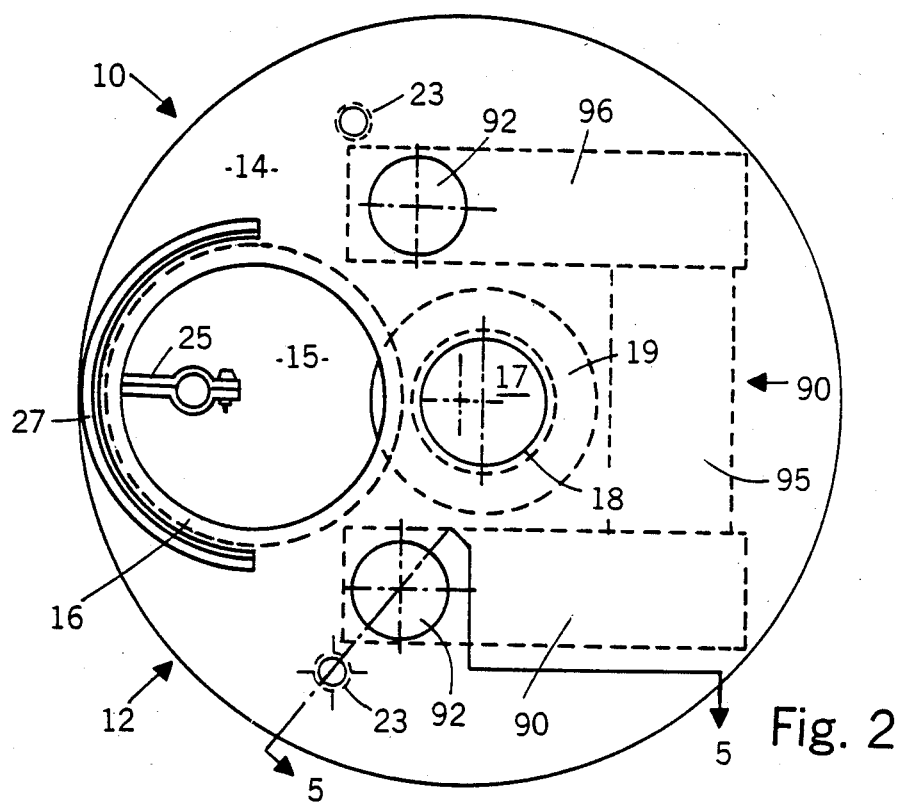
FIG. 2 is a top view of the body of the invention.
Figure 3:
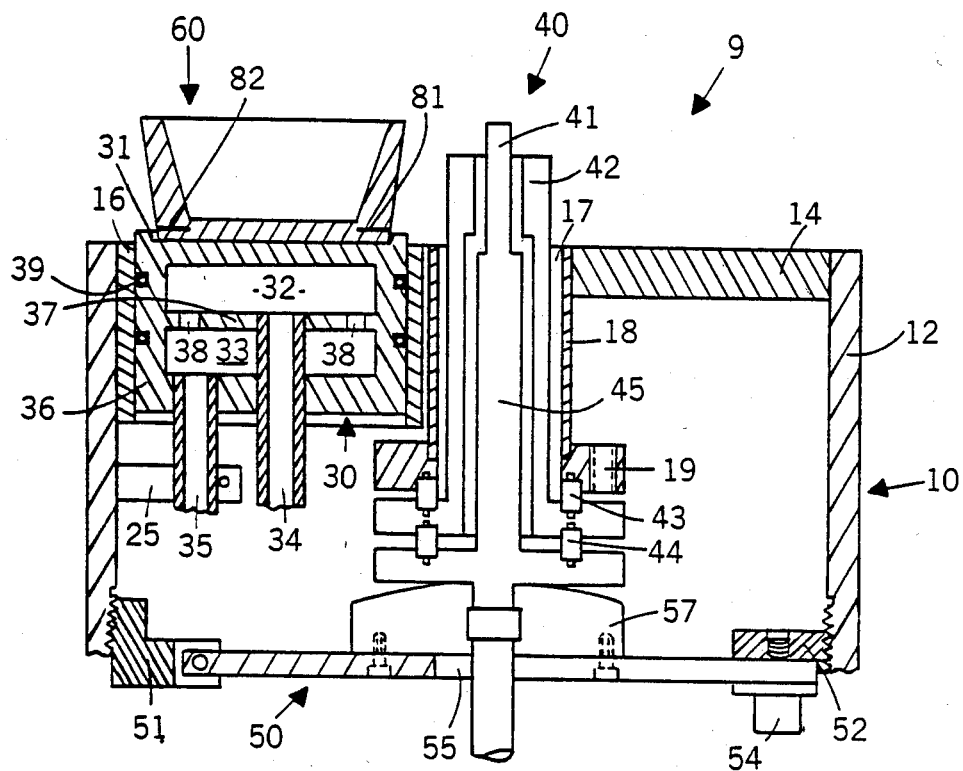
FIG. 3 is a cutaway view of the gun assembly.

As shown in FIG. 3, gun assembly 9 includes body 10 having a cylindrical outer surface 12 and an end plate 14. FIG. 2 shows that end plate 14 includes a first orifice 15 defined by a first cylindrical shell 16 adjacent to outer surface 12, and a second orifice 17 defined by a second cylindrical shell 18 near the center of plate 14. FIG. 3 shows that shell 18 is longer than shell 16 and includes a shell flange 19 at the end opposite plate 14.

Adjustably fitted within first orifice 15 is heat sink 30, which includes a recessed top surface 31, a spaced middle plate 37 and a spaced bottom plate 36, thereby defining an inlet chamber 32 and an outlet chamber 33. Inlet pipe 34 passes through bottom plate 36 and middle plate 37 to permit cooling fluid to pass into inlet chamber 32. Flow holes 38 from inlet chamber 32 permit the fluid to flow into outlet chamber 33, and outlet pipe 35 extending through bottom plate 36 provides a return flow of the fluid. Clamp 25 (one half of which is shown in FIG. 3) extending from outer surface 12 of body 10 may be tightly clamped to outlet pipe 35 to hold heat sink 30 rigidly within first orifice 15. Seals 39 along the outer surface of heat sink 30 provide a vacuum seal between top surface 31, which surface is within the evacuated chamber, and bottom plate 30, which plate is in room environment. By releasing clamp 25, heat sink 30 may be adjusted vertically to compensate for varying crucible heights.

Located within second orifice 17 is a vapor deposition gun, which preferably may be a hot hollow cathode gun 40. The structure of gun 40 is not shown in detail as it is not part of this invention. However, the conventional hot hollow cathode gun includes a stainless steel tube 45 with a tantalum tip 41 through which small quantities of argon or other gas flow into the vacuum chamber. Surrounding tube 45 and tip 41 is a liquid-cooled, electrically-isolated stainless steel shield 42, which reduces the occurrence of unwanted arcing around the outside of tube 41. Insulator spacing rings 43 and 44 keep shield 42 electrically insulated from second cylindrical shell 18 and tube 41 insulated from shield 42, respectively.

Figure 4:
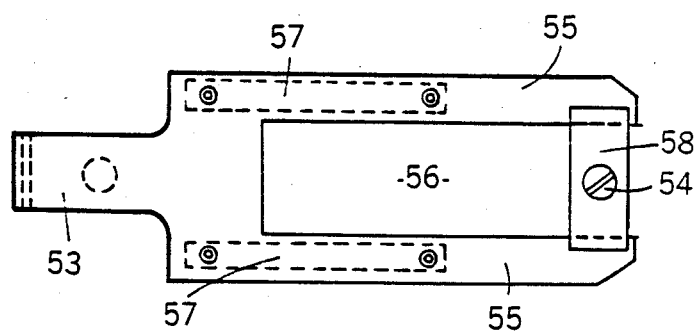
FIG. 4 is a bottom view of the gun retaining fork.

Since tube 41, shield 42 and rings 43 and 44 of gun 40 slide appart to permit easy substitution of worn components, gun holder means 50 is provided to hold gun 40 in operational alignment within body 10. As shown in FIGS. 3 and 4, gun holder 50 includes a pivot block 51 fastened to an interior surface of outer surface 12, a seat 52 mounted opposite block 51 on the interior surface of outer surface 12, and an elongated fork having one end 53 pivotally attahced to pivot block 51 and including a center portion having two spaced parallel arms 55 forming an opening 56 through which gas inlet pipe 45 for gun assembly 40 may pass. Insulated spacers 57 are attached to the parallel arms 55. A screw means 54 for selectively fastening and unfastening the other end of the fork to seat 52 includes a washer-like cross-bar 58 for spanning the ends of tines 55. When fork 53 is fastened to seat 52 as shown in FIG. 3, insulating spacers 57 contact the underside of gun tube 45, thereby holding gun 40 in position.

Figure 5:
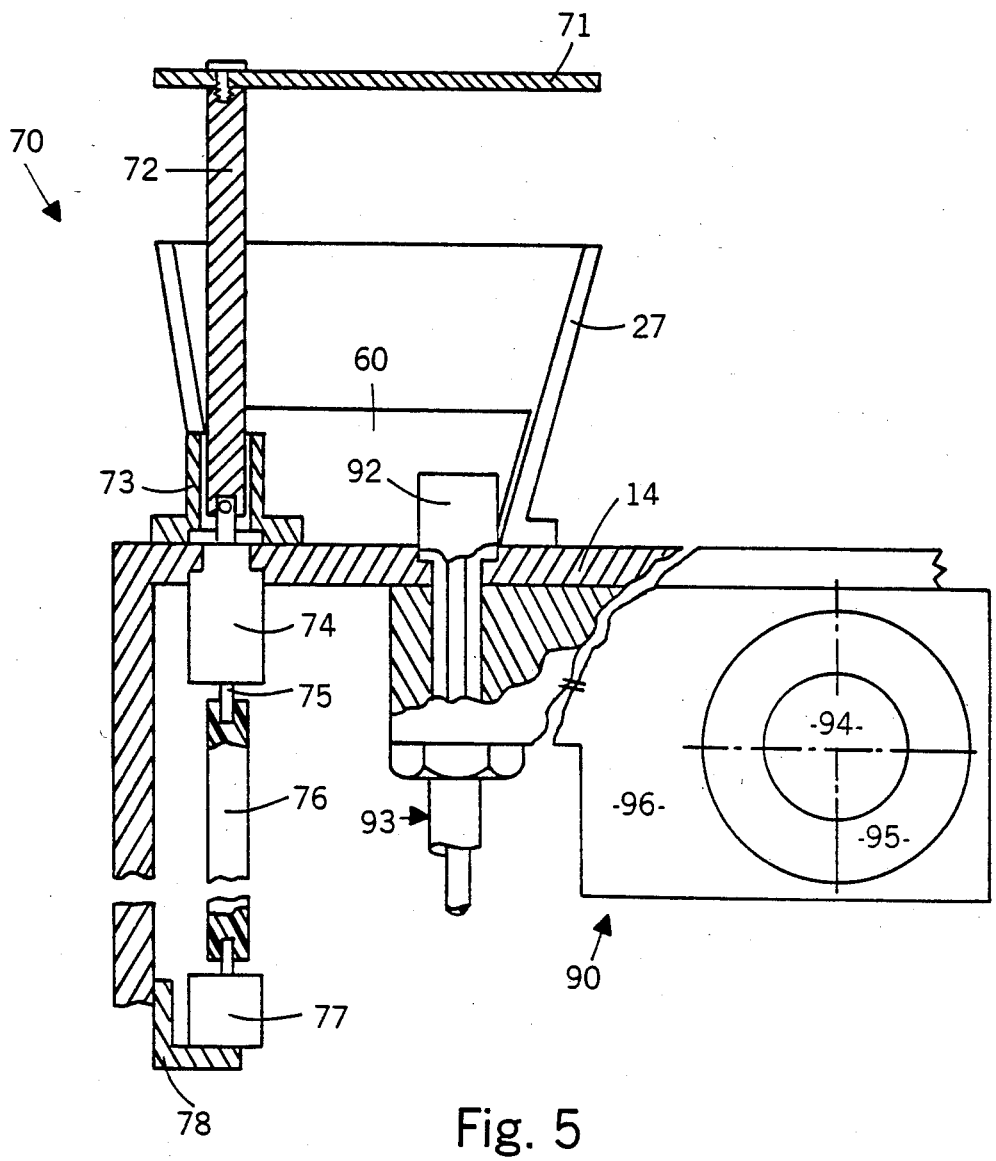
FIG. 5 is a partial cutaway view of the gun assembly.

Also shown in FIG. 3 is crucible 60 for holding the metal to be evaporated by the deposition system. The bottom of crucible 60 must make good heat-transfer contact with top surface 31 of heat sink 30. Thermocouples 81 and 82 are provided at opposite sides of the bottom of crucible 3. As shown in FIGS. 2 and 5, optional shield 27 may surround approximately half of crucible 60 to deflect heat from crucible 60 away from the inner wall of chamber 2. Shield 27 is configured such that crucible 60 may be easily placed on or removed from heat sink 30.

FIG. 5 also shows shutter assembly 70 and magnet 90 as viewed through line 5—5 of FIG. 2. Shutter assembly 70 includes a horizontally rotatable shutter plate 71 attached to one end of a pivoting inner arm 72. The other end of arm 72 is supported by an arm support 73 attached to end plate 14 and is connected to one end of shaft 75 of a Ferrometic Feed-Through 74, a commercially available device manufactured by Ferrofluidics Corporation which provides an excellent vacuum seal between rotatable shaft 75 end plate 14. An outer arm 76 connects the other end of shaft 75 with a motor 77, the motor being supported from outer surface 12 by a motor support bracket 78. In operation, motor 77 may be electrically actuated to move shutter plate 71 from the position shown over crucible 60 to a second position (shown in FIG. 1) wherein crucible 60 is uncovered. Limit switches (not shown) may also be provided to accurately position shutter 71.

Details of magnet 90 are also shown in FIG. 5. As shown in FIG. 2, two magnet pole extensions 92 are provided to steer the plasma from gun 40 into crucible 60. Each pole extension 92 is cooled by liquid circulating through coaxial coolant line 93. Magnet 90 further includes an electromagnet consisting of iron core 94 surrounded by many turns of copper wire 95, and two pole pieces 96 extending from each end of the electromagnet to carry the magnetic flux to pole extensions 92. The pole pieces are also liquid cooled by conventional means (not shown).

The advantages of the invention should now be apparent from the construction detailed above. The height of gun 9 above end plate 14 may easily be changed by changing the length of tantalum tip 41. This operation merely requires the removal of detachable gas and cooling lines and the loosening of screw 54, thereby enabling cross-bar 58 to be turned parallel to lines 55, allowing gun holder 50 to pivot away from gun 40. The height of crucible 60 may be adjusted with respect to the height of the tip of gun 40 by adjusting the position of heat sink 32. The height of the entire gun assembly 9 may be adjusted relative to substrate 8 merely by releasing clamp 7 and adjusting the height of body 10 within chamber 2. The position of crucible 60 with respect to substrate 8 may be adjusted by rotating gun assembly 9. If chamber 2 includes a plurality of holes, each hole capable of holding body 10, then the position of gun assembly 9 relative to the chamber may be further adjusted if covers are provided for unused holes. In addition, more than one gun assembly may be used at the same time to increase the deposition rate.

Furthermore, the temperature at each of thermocouples 81 and 82 may be monitored and used to center the plasma from tip 41 in crucible 3; a difference in temperatures indicating a noncentered beam. This operation is preferably continuously and automatically performed by the control system.

The particular sizes and equipment discussed above are cited merely to illustrate a particular embodiment of the invention. It is contemplated that the use of this invention may involve components having different shapes and sizes as long as the principle, using a vapor deposition system with easily interchangeable and movable parts, is followed. A system so constructed will provide a useful, convenient system for deposition on a substrate. It is intended that the scope of the invention be defined by the claims appended hereto.

We claim:

1. A vacuum vapor deposition gun assembly comprising:

a hollow body having a cylindrical outer surface and an end plate perpendicular to and fastened across one end of said surface;

a heat sink having a cylindrical outer surface and a crucible support plate perpendicular to and fastened across one end of said surface;

means for mounting said heat sink within a first orifice in said end plate with said support plate parallel to said end plate, said means providing a vacuum seal between said body and said sink;

a gun for providing a source of electrons for evaporating material to be deposited, said gun having a first cylindrical outer surface and a tip at one end of said surface;

means for rigidly mounting said gun within a second orifice in said body end plate, said means providing a vacuum seal between said body and said gun;

crucible means for holding material to be deposited, the bottom of said crucible contacting said crucible support plate;

a plurality of magnet means fastened to said body end plate for directing the gun output into said crucible; and shutter means affixed to said body for selectively covering or uncovering said crucible, thereby permitting control over release of deposition material.

2. The gun assembly of claim 1 wherein said heat sink further comprises a bottom plate fastened across the other end of said cylindrical surface; a middle plate fastened across said surface parallel to and spaced between said bottom plate and said support plate, said middle plate having a plurality of openings for cooling fluid; inlet pipe means for carrying cooling fluid to the space between said middle plate and said support plate; and outlet pipe means for carrying cooling fluid from the space between said middle plate and said bottom plate.

3. The gun assembly of claim 2 wherein said means for mounting said heat sink comprises a first hollow cylindrical shell extending from said first orifice, the inner diameter of said shell being approximately equal to the outer diameter of said heat sink outer surface; and gasket means for providing vacuum seal between said outer surface and said shell, said heat sink being slidable within said shell; and clamp means for fastening one of said pipe means relative to said body, thereby fastening said heat sink relative to said body.

4. The gun assembly of claim 3 wherein said crucible support plate includes a recess on an outer surface for receiving a bottom surface of said crucible; wherein the position of said heat sink is set so that the top of said crucible is even with said gun tip.

5. The gun assembly of claim 4 wherein said plurality of magnet means consist of two magnet pole extensions spaced on opposite sides of a reference line extending from the center of said crucible to said tip, an electromagnet spaced from said pole extensions within said hollow body, and a pole piece extending from each end of said electromagnet to one of said pole extensions.

6. The gun assembly of claim 5 wherein said shutter means comprises a rotatable shutter shaft extending through said body end plate; plate means for covering said crucible mounted at an outer end and perpendicular to said shaft, the area of said plate being greater than the area of the open end of said crucible; and motor means for selectively rotating the inner end of said shaft affixed to said inner surface of said body.

7. The gun assembly of claim 1 wherein said gun comprises a hot hollow cathode including a first flange extending from the inner end of said first cylindrical gun outer surface; a second gun cylindrical surface forming said tip at one end and having a second flange at the inner end, said tip extending beyond the outer end of said first outer surface and said second flange being spaced from said first flange by a first electrically insulated spacer ring.

8. The gun assembly of claim 7 wherein said means for rigidly mounting said gun comprise a second hollow cylindrical shell extending from said second body orifice, the inner diameter of said shell being larger than the outer diameter of said first gun outer surface; a shell flange extending from the inner end of said shell; a second insulating spacer ring for spacing said first flange from said shell flange; and means for pressing said second flange toward said shell flange to hold said gun in operating position.

9. The gun assembly of claim 8 wherein said means for pressing said flange comprises an elongate member pivoted at one end from an inner surface of said body and fastenable at the other end to said inner surface opposite said pivot; and insulator means mounted along said member for pressing against said second flange when said other end is fastened.

* * * * *